US005629216A

United States Patent [19]

Wijaranakula et al.

[11] Patent Number: 5,629,216
[45] Date of Patent: May 13, 1997

[54] METHOD FOR PRODUCING SEMICONDUCTOR WAFERS WITH LOW LIGHT SCATTERING ANOMALIES

[75] Inventors: Witawat Wijaranakula, Vancouver, Wash.; Sandra A. Archer, Portland, Oreg.; Dinesh C. Gupta, Vancouver, Wash.

[73] Assignee: Seh America, Inc., Vancouver, Wash.

[21] Appl. No.: 607,626

[22] Filed: Feb. 27, 1996

Related U.S. Application Data

[63] Continuation of Ser. No. 385,735, Feb. 8, 1995, abandoned, which is a continuation of Ser. No. 269,062, Jun. 30, 1994, abandoned.

[51] Int. Cl.⁶ .................................................. H01L 21/324
[52] U.S. Cl. ........................... 438/502; 117/13; 117/34; 148/DIG. 3; 148/DIG. 24; 148/DIG. 127; 438/14; 438/795
[58] Field of Search .............................. 437/247, 248, 437/939, 7, 8; 117/13, 34, 931; 148/DIG. 3, DIG. 24, DIG. 127

[56] References Cited

U.S. PATENT DOCUMENTS 5,209,811  5/1993  Kitagawara et al. .

FOREIGN PATENT DOCUMENTS

| 391709A2 | 10/1990 | European Pat. Off. . | |
|---|---|---|---|
| 503816A1 | 9/1992 | European Pat. Off. | 117/931 |
| 536958A1 | 4/1993 | European Pat. Off. | 117/13 |
| 3-233955 | 10/1991 | Japan . | |
| 3-233936 | 10/1991 | Japan . | |
| 3-246938 | 11/1991 | Japan . | |
| 3-276722 | 12/1991 | Japan . | |
| 4-42893 | 2/1992 | Japan | 117/13 |
| 2080780 | 2/1982 | United Kingdom . | |

OTHER PUBLICATIONS

W. Wijaranakula, "Dissolution kinetics of D defects in Czochralski silicon," *Journal of Applied Physics*, vol. 75, No. 7, Apr. 1994, pp. 3678–3680.

Ryuta, Jiro, et al., JPN. J. Appl. Phys. vol. 31 (1992) pp. L293–L295.

Ryuta, Jiro, et al., JPN. J. Appl. Phys. vol. 29 (1990) pp. L1947–L1949.

E. Biedermann, et al., IBM Tech. Discl. Bulletin 19, 4 (1976)1295. "Producing Si . . . with . . . Surface . . . Free from Defects".

*Primary Examiner*—Charles L. Bowers, Jr.
*Assistant Examiner*—Leon Radomsky
*Attorney, Agent, or Firm*—Loeb & Loeb LLP

[57] ABSTRACT

A monitor wafer used to determine the cleanliness of a wafer fabrication environment requires a surface having a minimum of light scattering anomalies so that contamination deposited by the environment is not confused with light scattering anomalies initially on the monitor wafers. In the present invention, ingots of a single-crystal semiconductor are grown at a reduced pull rate and wafers produced from the ingot are annealed within a preferred temperature range that varies with the pull rate to produce wafers having reduced light-scattering anomalies on their surfaces. The number of light-scattering anomalies increases at a slower rate upon repetitive cleaning cycles than does the number of light-scattering anomalies of prior art wafers.

12 Claims, 3 Drawing Sheets

METHOD FOR PRODUCING SEMICONDUCTOR WAFERS WITH LOW LIGHT SCATTERING ANOMALIES

This is a continuation of application Ser. No. 08/385,735 filed Feb. 8, 1995, and now abandoned, which is itself a continuation of application Ser. No. 08/269,062 filed Jun. 30, 1994, also abandoned.

TECHNICAL FIELD

This invention relates to semiconductor wafers having improved surface quality, and in particular, to semiconductor wafers suitable for monitoring process cleanliness.

BACKGROUND OF THE INVENTION

Modern integrated circuits ("ICs") are composed of up to several million individual devices, such as transistors and capacitors, fabricated on a single-crystal substrate of a semiconductor material, such as silicon. The processes used in the fabrication of ICs are continuously being improved to allow the manufacture of ever smaller devices to increase device speed and density in the IC. Faster and denser ICs lead to more powerful and less expensive electronic products, such as computers and video equipment.

Contamination control is a vital aspect of modern IC fabrication. Contamination, such as microscopic particles, on the wafer surface adversely affects the performance of electronic devices fabricated over the contamination. As smaller lines are used to compose and connect the devices, small particles that were previously undetected or ignored can interfere with the functioning of the circuit. Line widths of 0.5 µm and smaller are currently being used in the fabrication of ICs, and contamination as small as 0.1 µm is suspected to adversely affect device yield, i.e., the number of good die per wafer.

Contamination particles are typically detected using commercially available systems that scan the wafer surface with laser light and detect light reflected by the silicon surface and light scattered by particles on the surface. Most of the light is reflected by the highly polished wafer surface directly into a "light channel" photomultiplier or detector. Any particle in the path of the light beam will scatter some of the light into a "dark channel" photomultiplier. If a particle is sufficiently large, it will cause a significant decrease in the light intensity at the light channel photomultiplier. Signals from both the light and dark channel photomultipliers are processed and analyzed to detect the presence of particles.

ICs are typically fabricated in clean rooms or sealed environments having filtered air with extremely low airborne particle levels to reduce the number of particles deposited onto the wafers. Process liquids that contact the wafers are finely filtered to reduce the number of particles attracted to the wafer surface from process liquid. Prior to production of ICs, wafers are also thoroughly cleaned using highly filtered cleaning chemical solutions to remove particles on the surface. The entire processing environment, including the air, process gases and liquids, equipment, and equipment operators, are strictly controlled to improved process yield. To monitor the cleanliness of the IC processing environment, extremely clean wafers known as "monitor" wafers are used to detect the number of particles deposited on the production or "prime" wafers during various process steps. Although the electrical properties of monitor wafers are not critical, the surface of monitor wafers should be free of particles, pits, or other such light scattering anomalies that can be mistaken for particles deposited from the environment being monitored. Monitor wafers are, therefore, cleaned very thoroughly before use.

It has been found, however, that cleaning the polished silicon wafers does not reduce the number of light scattering anomalies below a certain level. In fact, repetitively cleaning polished silicon wafers using a standard SC1 cleaning process comprising $NH_4OH$, $H_2O_2$, and $H_2O$ actually increases the number of light scattering anomalies detected by laser inspection systems as reported by Ryuta, et al., "Crystal-Originated Singularities on Si Wafer Surface after SC1 Cleaning," 29 Japanese Journal of Applied Physics L1947–49. Cleaning, therefore, improves monitor wafer surfaces up to a point, but further cleaning actually appears to produce additional light-scattering anomalies. As the line width of devices becomes ever-smaller, improved monitor wafers are required to achieve to improve the cleanliness of the wafer processing environment for the electronics industry.

SUMMARY OF THE INVENTION

An object of this invention is, therefore, to produce an improved semiconductor monitor wafer for monitoring the cleanliness of the IC fabrication environment.

Another object of the present invention is to produce a semiconductor wafer having a reduced number of light-scattering anomalies on its surface.

Both monitor and prime semiconductor wafers for the electronics industry are typically grown using the czochralski ("CZ") crystal-pulling method. In the CZ method, polycrystalline silicon is melted in a quartz crucible. The growth process begins by dipping the tip of a single-crystal seed into a molten semiconductor (the "melt") and the single crystal seed is then slowly pulled from the molten semiconductor to produce a single-crystal ingot of the semiconductor material. The crucible and seed are typically rotated in an opposite directions in order to produce a cylindrical crystal shape and uniform doping impurity distribution.

In any crystal growing method, the crystal growth rate, i.e., the rate at which a crystal is solidified, is typically optimized to produce a single crystal ingot of the desired crystal quality and diameter in the least amount of time. In the CZ method, the growth rate is defined by the rate at which the seed crystal is pulled from the melt, i.e., the "pull rate." The crystal pull rate is typically reduced as the crystal length increases in order to maintain a constant crystal diameter. Standard or nominal pull rates have been developed, which vary depending upon properties, such as composition, diameter, and orientation, of the ingot being grown. According to one aspect of the present invention, reducing the pull rate of the ingot reduces the number of light-scattering anomalies on the polished surfaces of wafers produced from that ingot. Reducing the pull rate also reduces the increase of light-scattering anomalies on the polished wafer surface caused by subsequent cleaning operations.

After the ingot is grown, it typically undergoes a series of operations, such as grinding and etching, before it is sliced into wafers. The wafers undergo a series of shaping operations, such as edge-grinding, lapping, and etching, and then they are polished and cleaned before they serve as substrates for the fabrication of ICs. According to another aspect of the present invention, the wafer originated from a Czochralski crystal with a reduced pull rate is annealed at some point after it has been sliced from the ingot. The annealing can be done, for example, after the wafer is lapped. The wafer is annealed within a predetermined temperature range that is effective to reduce light-scattering anomalies on the wafer surface after cleaning. The preferred temperature range depends upon the growth rate of the ingot from which the wafer was produced. Annealing the wafer within the predetermined temperature range reduces the number of light-scattering anomalies detected on the wafer surface and reduces the rate of increase of light-scattering anomalies on the polished wafer surface caused by subsequent cleaning operations.

A combination of a reduced growth rate and annealing the wafer at an effective temperature results in a further reduction of light-scattering anomalies after cleaning.

Because monitor wafers of the present invention have fewer light scattering anomalies on their surfaces, the number of particles deposited on the wafer surfaces in the environment being monitored can be more accurately determined, thereby allowing a more accurate characterization of the cleanliness of the environment.

Additional objects and advantages of the present invention will be apparent from the following detailed description of preferred embodiments thereof, which proceeds with reference to the accompanying drawings.

DETAILED DESCRIPTION OF PREFERRED EMBODIMENTS

According to the present invention, semiconductor wafers are produced by a process that reduces the number of light-scattering anomalies on the wafer surface and that reduces the increase of light-scattering anomalies with subsequent cleaning steps. The reduction in the number and increase of light-scattering anomalies is achieved by reducing below a nominal rate the pull rate of the ingot from which the wafers are produced and by annealing the wafers in an effective temperature range dependent upon the pull rate of the ingot. Decreasing the ingot pull rate and annealing the wafers result in wafers having a surface with fewer light-scattering anomalies than decreasing the ingot pull rate or controlling the annealing temperature range of the wafers alone.

Figure 1:
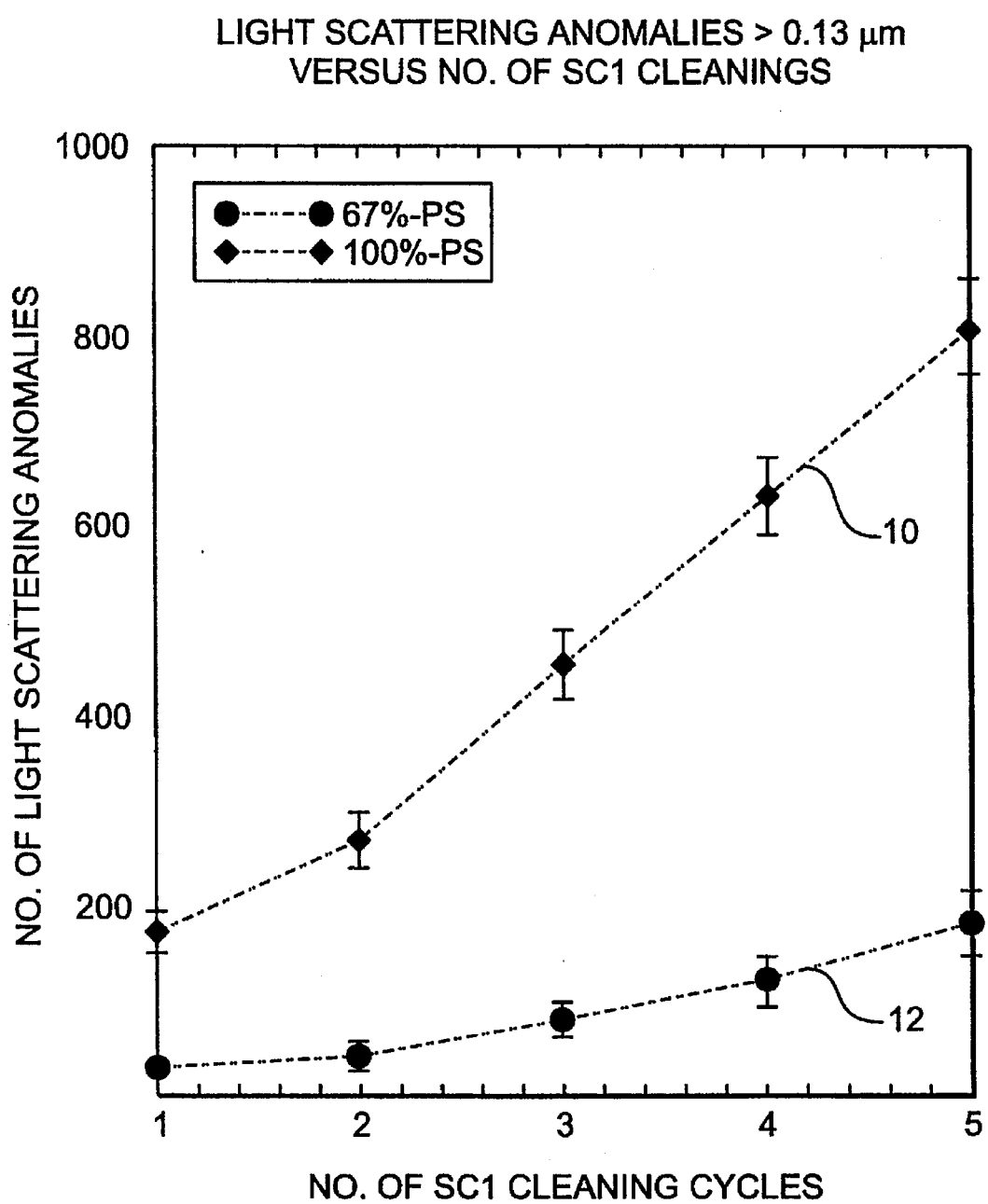
FIG. 1 is a graph showing, for wafers produced from ingots grown at 100% and 67% of the nominal pull rate, the average number of light-scattering anomalies detected on the wafer surfaces versus the number of times the wafers were processed through an SC1 cleaning process.

FIG. 1 is a graph showing the average number of light-scattering anomalies detected on wafer surfaces versus the number of times the wafers were cleaned using a standard SC1 cleaning process using a solution comprising $NH_4OH$, $H_2O_2$, and $H_2O$ in a ratio of 2:1:18. Curves 10 and 12 represent light-scattering anomalies detected on the surfaces of wafers from an ingot grown, respectively, using a nominal crystal pull rate and using a crystal pull rate that is 67% of the nominal rate.

FIG. 1 shows that in either case the number of light-scattering anomalies detected increases with the number of times the wafers are cleaned. The total number of light-scattering anomalies detected is much less for wafers sliced from ingots grown at a reduced pull rate, and the rate of increase in the number of particles with the number of times cleaned is less for wafers sliced from ingots grown at a reduced pull rate.

Table 1 below lists examples of nominal pull rates for growing crystals of different diameters and effective ranges of pull rates in accordance with the present invention to reduce light-scattering anomalies on the cleaned, polished wafer. It will be understood that the exact pull rates will depend upon the semiconductor material being grown into a crystal and the conditions in a particular growing furnace; therefore, the nominal and effective ranges presented are only examples. In this example, the effective range is approximately 67% of the normal pull rate. As the pull rate is reduced below the effective ranges of Table 1, the resulting wafers will continue to exhibit reduced light-scattering anomalies, but the efficiency of the growing process will diminish to an extent unacceptable for mass production.

TABLE 1

| Wafer | PULL RATE (mm/min) | |
|---|---|---|
| diameter | Nominal Range | Effective Range |
| 150 mm | 1.8–0.9 | 1.2–0.6 |
| 200 mm | 1.0–0.5 | 0.7–0.3 |

Figure 2:
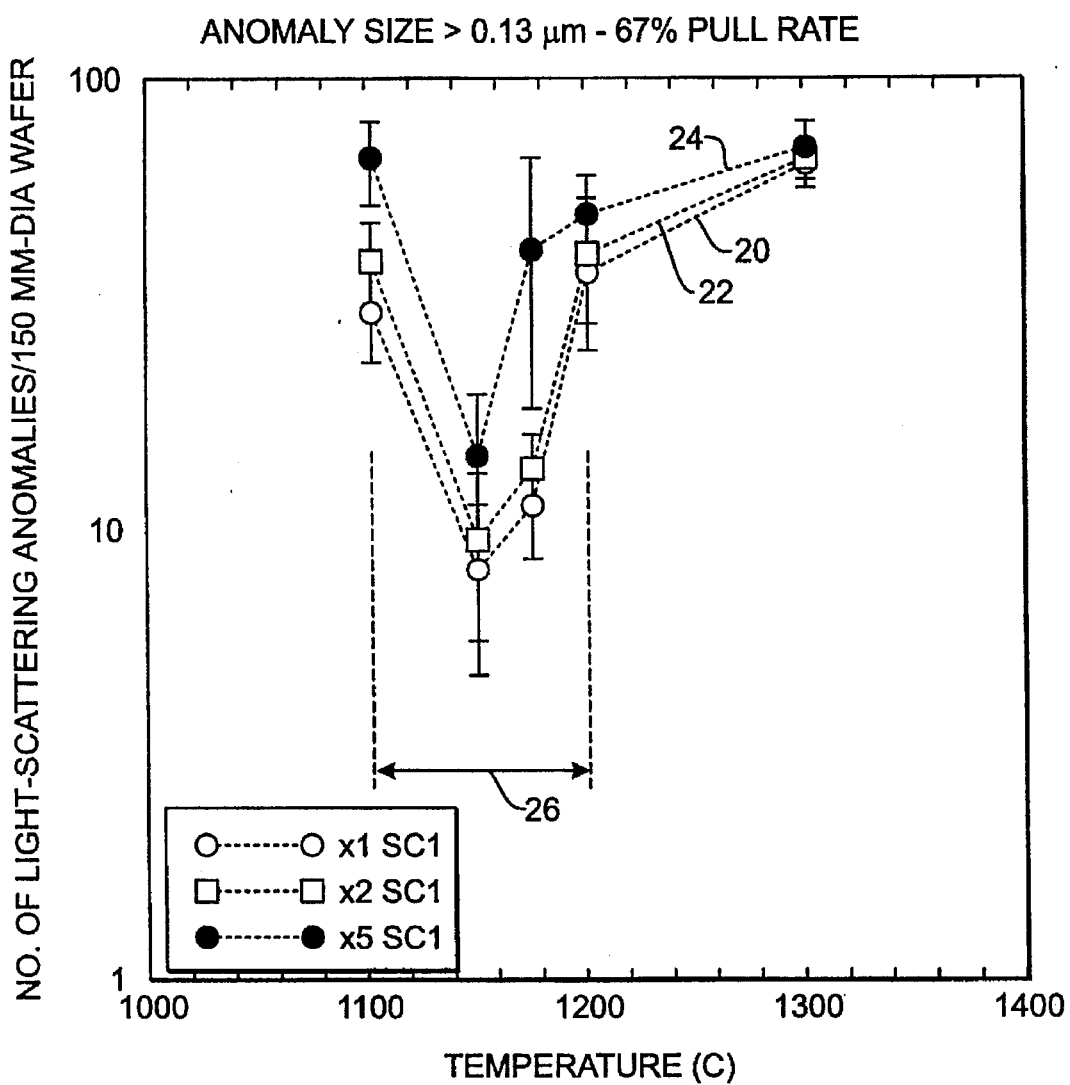
FIG. 2 is a graph showing, for wafers produced from ingots grown at 67% of the nominal crystal pull rate and processed once, twice, and five times through a SC1 cleaning process, the average number of light-scattering anomalies detected on the wafer surfaces versus the temperature during a two-hour anneal.

FIG. 2 is a graph showing, for wafers produced from ingots grown at 67% of the nominal pull rate, the average number of particles detected on wafer surfaces versus the temperature used during a two-hour anneal for wafers that were later processed through a SC1 cleaning process once (curve 20), twice (curve 22), and five times (curve 24). Wafers that are annealed within a preferred temperature range 26 of about 1,100° C. to 1,190° C. exhibit fewer light-scattering anomalies than wafers annealed at temperatures outside of preferred range 26. Comparing wafers at a particular annealing temperature that underwent a different number of repetitions of the SC1 cleaning process, the number of light-scattering anomalies increases with the number of repetitions of the cleaning process. Annealing wafers within preferred range 26 produces wafers having fewer light-scattering anomalies than wafers cleaned a similar number of times and annealed at temperatures outside of preferred range 26 regardless of the number of cleanings.

The preferred temperature range depends upon the crystal pull rate. In FIG. 2, the crystal was pulled from the melt at 0.9 mm/min., 67% of the nominal pull rate for an ingot used to produce 150 mm wafers. A crystal pulled from the melt at a different pull rate will have a different preferred annealing temperature range that can be determined empirically. FIG. 2 shows that annealing within a temperature range from 1,100° C. to 1,300° C. effectively reduces the number of light-scattering anomalies and that range 26 from 1,100° C. to 1,190° C., which corresponds to the neighborhood of a local minimum of the light scattering anomaly versus annealing temperature graph and is shown by a "dip" in the graph, is preferred. The optimum annealing temperature was 1,150° C., which corresponds to the local minimum of the graph. The effective and preferred annealing temperature ranges and optimum annealing temperature will vary for different crystal growing conditions and can be found empirically by collecting data similar to those plotted in FIG. 2.

EXAMPLE 1

(Reduced Pull Rate and Wafer Anneal)

A 1-0-0 orientation, p-type, single-crystal ingot of silicon was grown using a conventional CZ crystal growing process, but the pull rate was 0.9 mm/min, 67% percent of the nominal pull rate of 1.3 mm/min. After pulling, the ingot was processed in a conventional manner to produce polished 150 mm wafers, i.e., the ingot was ground to a predetermined diameter with a reference flat and sliced into wafers, which were edge-rounded, lapped, and etched. The wafers had dopant concentrations of between $8 \times 10^{14}$ and $1 \times 10^{16}$ atoms/cm$^3$ of boron. The interstitial oxygen concentration, as determined by Fourier transform infrared spectroscopy ("FTIR") analysis calibrated using the coefficient of $2.45 \times 10^{17}$ cm$^{-2}$, was between $6 \times 10^{17}$ atoms/cm$^3$ and $7 \times 10^{17}$ atoms/cm$^3$. The substitutional carbon concentration was below the FTIR detection limit of $2.5 \times 10^{15}$ atoms/cm$^3$.

After polishing, the wafers were annealed by placing them in an annealing oven at 800° C. in a dry $O_2$ ambient. The temperature of the oven was increased by 5° C./min to 1,150° C. The wafers were held in the 1,150° C. oven for two hours and then cooled at a rate of 2° C./min to 800° C., at which time the wafers were removed from the oven and allowed to cool to room temperature.

After the annealing step, the oxide film grown on the silicon surface during annealing was stripped in hydrofluoric acid, and the wafers were rinsed in highly filtered water. The wafers were then polished and cleaned using a standard SC1 cleaning process using a solution comprising $NH_4OH$, $H_2O_2$, and $H_2O$ in a ratio of 2:1:18. An average of 7.99 light-scattering anomalies was detected using a laser particle counter. After a second SC1 cleaning process, the average number of particles found was 9.4, and after a total of five SC1 cleaning processes, the number of particles found was 14.5.

EXAMPLE 2

(Nominal Pull Rate, Wafer Anneal)

An ingot was grown in the same manner as that described above in Example 1, with an annealing step at 1,150° C., but using the conventional pull rate of 1.3 mm/min. After the initial SC1 cleaning process, an average of 19.6 light-scattering anomalies were detected. After a second SC1 cleaning process, the average number of light-scattering anomalies found was 27.3 and after a total of five SC1 cleaning processes, the number of light-scattering anomalies was found to be 44.2.

Figure 3:
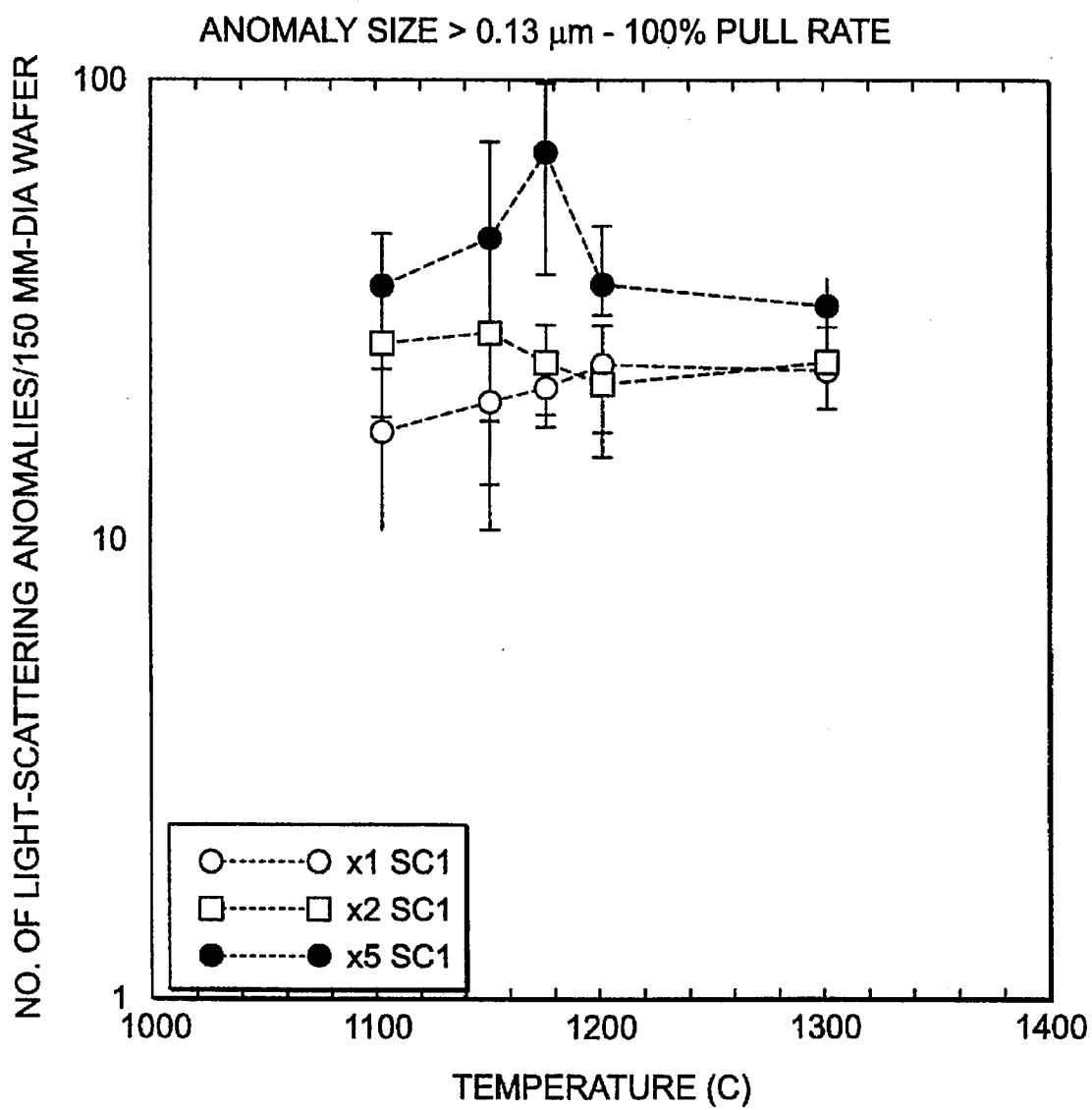
FIG. 3 is a graph showing, for wafers produced from ingots grown at a nominal crystal pull rate and processed once, twice, and five times through a SC1 cleaning process, the average number of light-scattering anomalies detected on the wafer surfaces versus the temperature during a two-hour anneal.

FIG. 3 shows the number of light-scattering anomalies detected on the surface of wafers produced from ingots grown using a nominal pull rate, the wafers subsequently having been annealed over a range of temperatures.

EXAMPLE 3

(Reduced Pull Rate, No Anneal)

Silicon wafers were produced by the reduced pull rate process described in Example 1, but without the annealing step. FIG. 1 shows that after the initial cleaning process, an average of 29.2 light-scattering anomalies was detected. After a second SC1 cleaning process, the average number of light-scattering anomalies found was 41.6 and after a total of five SC1 cleaning processes, the number of light-scattering anomalies found was 181.2.

Control (Nominal Pull Rate, No Anneal)

Wafers of the type described in Example 1 were produced using a convention process, i.e., using a nominal pull rate of 1.3 mm/min to grow the ingot and without a wafer annealing step. FIG. 1 shows that after the initial cleaning process, an average of 172 light-scattering anomalies was detected. After a second SC1 cleaning process, the average number of light-scattering anomalies found was 268.1 and after a total of five SC1 cleaning processes, the number of light-scattering anomalies found was 809.8.

Comparing FIGS. 2 and 3, it is apparent that the preferred annealing temperature of the wafers depends upon the growth rate of the ingot from which the wafers were produced. It is also apparent that reducing the growth rate and annealing the wafers within an effective temperature range produces a superior wafer surface compared to wafers produced using only the reduced growth rate or only the annealing step.

Because of their superior surface quality, wafers produced in accordance with the present invention are particularly well suited for use as monitor wafers. The significant numbers of light-scattering anomalies found on prior art monitor wafers made it difficult to determine how many particles were actually deposited on the monitor wafer surface by the processing environment and how many light scattering anomalies were initially present on the surface of the monitor wafer. Wafers of the present invention can have so few light-scattering anomalies that virtually all scattering centers detected on the monitor wafers can be considered to have been deposited by the processing environment. Obviously, the superior surface quality of wafers of the present invention also makes them suitable for use as prime, production wafers.

It will be obvious that many changes may be made to the above-described details of the invention without departing from the underlying principles thereof. For example, although the example describes growing a silicon ingot using a standard CZ process, the invention is applicable to variations of the standard CZ process, such as a magnetic CZ process. Obviously, wafers of the present invention can also be used to monitor environments other than IC fabrication environments. The scope of the present invention should, therefore, be determined only by the following claims.

We claim:

1. A method of producing a semiconductor wafer having a reduced quantity of light-scattering anomalies, the quantity of light scattering anomalies being characterized at a particular crystal-pulling rate by a graph of quantity of light scattering anomalies versus annealing temperature, the graph for a particular crystal-pulling rate having a local minimum corresponding to a preferred annealing temperature, the method comprising:

selecting a reduced crystal-pulling rate to grow a semiconductor crystal, the reduced crystal-pulling rate corresponding to semiconductor wafers having a first quantity of light scattering anomalies that is significantly less than a nominal quantity of light scattering anomalies corresponding to a nominal crystal-pulling rate;

producing a graph of the quantity of light scattering anomalies versus annealing temperature for the selected reduced crystal-pulling rate the graph having a local minimum;

growing from a melt a semiconductor crystal using the selected reduced crystal-pulling rate;

slicing the crystal into at least one wafer;

shaping the wafer;

determining an annealing temperature within a neighborhood of the local minimum of the graph of the quantity of light scattering anomalies versus annealing temperature for the selected reduced crystal-pulling rate;

annealing the wafer at the determined annealing temperature in an oxidizing environment to reduce the number of light-scattering anomalies on the surface of the wafer after polishing and cleaning;

polishing the wafer; and cleaning the wafer.

2. The method of claim 1 in which growing a semiconductor crystal includes growing a single crystal silicon ingot using a Czochralski process.

3. The method of claim 1 in which growing a semiconductor wafer includes growing a compound semiconductor.

4. The method of claim 1 in which annealing the wafer within a temperature range effective to reduce the number of light-scattering anomalies on the finished wafer includes annealing the wafer at a temperature of between 1100° C. and 1300° C.

5. The method of claim 1 in which annealing the wafer within a temperature range effective to reduce the number of light-scattering anomalies on the finished wafer includes annealing the wafer at a temperature of between 1100° C. and 1190° C.

6. The method of claim 1 in which growing the semiconductor crystal includes growing a semiconductor crystal at a crystal-pulling rate that is less than 80% of the nominal crystal-pulling rate for the corresponding diameter.

7. The method of claim 1 in which growing the semiconductor crystal includes growing a semiconductor crystal at a crystal-pulling rate of approximately two thirds of the nominal crystal-pulling rate for the corresponding diameter.

8. The method of claim 1 in which growing the semiconductor crystal includes growing a semiconductor crystal at a crystal-pulling rate of less than 80% of the nominal crystal-pulling rate for the corresponding diameter and in which annealing the wafer includes annealing the wafer at a temperature of between 1100° C. and 1190° C.

9. The method of claim 1 in which growing the semiconductor crystal includes growing a semiconductor crystal at a crystal-pulling rate of approximately two thirds of the nominal crystal-pulling rate for the corresponding diameter and in which annealing the wafer includes annealing the wafer at a temperature of between 1100° C. and 1190° C.

10. The method of claim 1 in which growing the semiconductor crystal includes growing a semiconductor crystal at a crystal-pulling rate of approximately two thirds of the nominal crystal-pulling rate for the corresponding diameter and in which annealing the wafer includes annealing the wafer at a temperature of approximately 1150° C.

11. The method of claim 1 in which the annealing is performed in an atmosphere including dry $O_2$.

12. The method of claim 1 in which determining an annealing temperature within the neighborhood of the local minimum includes determining an annealing temperature that is approximately equal to that of the local minimum.

* * * * *